United States Patent [19]
Kubota

[11] Patent Number: 5,802,186
[45] Date of Patent: Sep. 1, 1998

[54] AUDIO SIGNAL PROCESSING APPARATUS

[75] Inventor: Kazunobu Kubota, Saitama, Japan

[73] Assignee: Sony Corporation, Tokyo, Japan

[21] Appl. No.: 759,811

[22] Filed: Dec. 3, 1996

[30] Foreign Application Priority Data

Dec. 6, 1995 [JP] Japan ................................ 7-344350

[51] Int. Cl.⁶ ...................................................... H03G 3/00
[52] U.S. Cl. .................................................. 381/107; 341/131
[58] Field of Search ................................. 381/104, 105, 381/107, 108, 109; 341/131

[56] References Cited

U.S. PATENT DOCUMENTS 4,551,688  11/1985  Craiglow ................................ 330/280
4,831,464  5/1989  Chijiiwa .

*Primary Examiner*—Forester W. Isen
*Attorney, Agent, or Firm*—Jay H. Maioli

[57] ABSTRACT

An audio signal processing apparatus wherein an unnatural variation of the output signal level is prevented when the signal levels are corrected in an interlocking relationship between the input and the output to and from an arithmetic processing element, wherein correction of the output signal level which is performed in an interlocking relationship with correction of the input signal level is delayed by a time equal to a delay time by the arithmetic processing element.

4 Claims, 6 Drawing Sheets

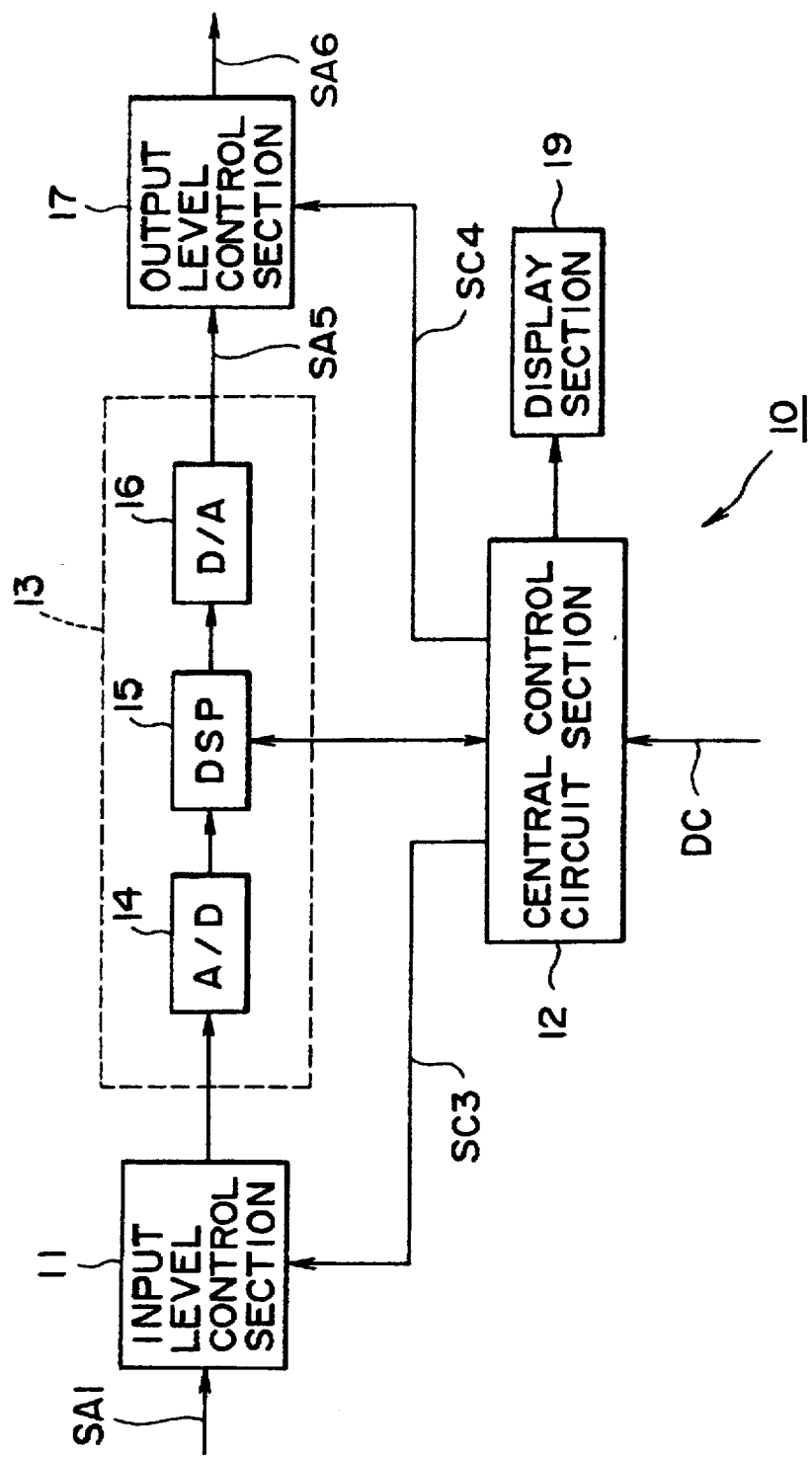

AUDIO SIGNAL PROCESSING APPARATUS

BACKGROUND OF THE INVENTION

1. Field of the Invention

This invention relates to an audio signal processing apparatus, and more particularly to an audio signal processing apparatus wherein, for example, when a digital effector adds an effect such as reverberation, correction of the signal level on the output side which is performed in an interlocking relationship with correction of the signal level on the input side is delayed by a time equal to a delay time of an arithmetic processing element to prevent an unnatural variation of the output signal level.

2. Description of the Prior Art

Conventionally, a digital effector which is a kind of an audio signal processing apparatus can arithmetically process an audio signal successively inputted thereto to provide various effects such as reverberation to the audio signal or provide effects of auditions obtained in various sound fields to the audio signal. The digital effector corrects, upon arithmetic processing of an audio signal, the signal levels in an interlocking relationship between the input to and the output from the same to assure a high degree of accuracy in arithmetic processing.

FIG. 1 is a block diagram showing a digital effector. Referring to FIG. 1, the digital effector 1 shown includes a central control circuit section 2 which controls operation of the entire digital effector 1 so as to process an input audio signal SA1.

In particular, the central control circuit section 2 in the digital effector 1 is formed from a microcomputer which controls operation of the entire digital effector 1 and outputs control data to an arithmetic circuit section 3 in response to a control command DC inputted thereto from an external apparatus such as a controller in order to set various effects to be added to an audio signal. Further, the central control circuit section 2 outputs a level control signal SC1 to an input level control section 4 and an output level control section 5 in response to an operation of an operator.

The input level control section 4 varies the gain thereof in response to the level control signal SC1 and amplifies, or suppresses the signal level of, the input audio signal SA1 with the varied gain such that it outputs the amplified or suppressed signal level audio signal. Here, the input level control section 4 corrects the signal level of the input audio signal SA1 so that the peak level of an output signal thereof to the following arithmetic circuit section 3 may remain within a prescribed range, and outputs the audio signal of the corrected signal level to the arithmetic circuit section 3.

The following arithmetic circuit section 3 is formed from a digital signal processor and performs analog to digital conversion processing of the audio signal from the input level control section 4 to produce a digital audio signal, and successively arithmetically processes, by an arithmetic processing circuit (not shown) of a digital filter circuit configuration thereof, audio data which form the digital audio signal. In this instance, the arithmetic circuit section 3 switches the characteristic of the arithmetic processing circuit in response to control data outputted from the central control circuit section 2 so as to apply such effects as reverberation of a desired reverberation time or apply effects of auditions obtained in various sound fields to the digital audio signal. Further, the arithmetic circuit section 3 performs digital to analog conversion of the digital audio signal formed as a result of the arithmetic processing to produce an audio signal SA3.

The following output level control section 5 varies the gain thereof in an interlocking relationship with the input level control section 4 in response to the level control signal SC1, and amplifies, or suppresses the signal level of, the audio signal SA3 outputted from the arithmetic circuit section 3 and outputs a resulting audio signal. In this instance, the output level control section 5 corrects the signal level of the audio signal SA3, for example, with a reverse characteristic to that of the input level control section 4, or in other words, with the gain of 1/X where X is the gain of the input level control section 4. Consequently, the output level control section 5 outputs the audio signal SA3 with a signal level equal to that of the input audio signal SA1.

As the signal levels of the input and output signals to and from the digital effector 1 are corrected in an interlocking relationship with each other in this manner, the arithmetic circuit section 3 can process an audio signal utilizing the dynamic ranges of an analog to digital conversion circuit and a digital to analog conversion circuit sufficiently so that the digital effector 1 can assure a high degree of accuracy in arithmetic processing.

As seen from FIGS. 2(A) to 2(C), when an audio signal is processed by digital signal processing in this manner, the audio signal SA3 (FIG. 2(B)) outputted from the arithmetic circuit section 3 is outputted in a delayed relationship by a time T required for the arithmetic processing from the input audio signal SA1 (FIG. 2(A)). When an audio signal is processed by an ordinary digital signal processor, the time of approximately 1 msec. is required for each of analog to digital conversion processing and digital to analog signal processing, and the time of at least one word clock is required for arithmetic processing. Consequently, the audio signal SA3 in this instance is outputted in a delayed relationship by the delay time T of approximately 3 to 5 msec. Further, in such arithmetic processing, when delaying processing is performed intentionally, the delay time amounts to several tens msec. to several sec.

Consequently, if the signal levels are corrected in an interlocking relationship with each other between the input and output terminals of the digital effector 1, then an audio signal SA4 outputted from the output level control section 5 exhibits, for a time period of the delay time T after the gain is switched at a time point t1 by the input level control section 4, a discontinuous signal level relative to those of the audio signal at times preceding to and following the time period (FIG. 2(C)). In this instance, depending upon contents of processing of the arithmetic circuit section 3 or the signal waveform of the input audio signal SA1, clip noise or like noise is produced, resulting in production of foreign sound. Further, even if such foreign sound is not perceived, since the signal level varies unnaturally, it provides an auditorily unfamiliar feeling.

Therefore, an output interruption circuit 6 for outputting the audio signal SA4 outputted from the output level control section 5 to an external apparatus stops, under the control of the central control circuit section 2, outputting of the audio signal SA4 for a time period of the delay time T after the gain is switched by the input level control section 4. Consequently, the digital effector 1 of the type described above stops outputting of an audio signal for a period of time within which the signal level of the audio signal varies unnaturally to effectively prevent production of noise.

Where outputting of an audio signal is stopped for a period of time within which the signal level of the audio signal varies unnaturally in this manner, as viewed from the output side, the continuous outputting of the audio signal is temporarily stopped after all. Consequently, the conventional digital effector is disadvantageous in that an auditory unfamiliar feeling cannot be eliminated completely.

OBJECT AND SUMMARY OF THE INVENTION

It is an object of the present invention to provide an audio signal processing apparatus wherein an unnatural variation of the output signal level is prevented when the signal levels are corrected in an interlocking relationship between the input and the output to and from an arithmetic processing element.

It is another object of the present invention to provide an audio signal processing apparatus wherein an unnatural variation of the output signal level is prevented by controlling the input signal level, for example, to a digital effector so that the peak level of a digital signal processing (arithmetic) circuit may remain within a desired range and performing the output level control in a delayed relationship from the input level control.

In order to attain the objects described above, according to an aspect of the present invention, there is provided an audio signal processing apparatus wherein an input audio signal successively inputted thereto is arithmetically processed to apply various processes to the audio signal and a resulting signal is outputted, including input level control means for correcting a signal level of the input audio signal, arithmetic processing means for arithmetically processing the audio signal outputted from the input level control means, output level control means for correcting the signal level of the audio signal outputted from the arithmetic processing means in an interlocking relationship with correction of the signal level by the input level control means, and delay means for delaying the correction of the signal level by the output level control means from the correction of the signal level by the input level control means in response to a delay time produced with the audio signal by the arithmetic means.

According to another aspect of the present invention, there is provided an audio signal processing apparatus wherein an input audio signal successively inputted thereto is arithmetically processed to apply various processes to the audio signal and a resulting signal is outputted, including input level control means for correcting a signal level of the input audio signal, arithmetic processing means for arithmetically processing the audio signal outputted from the input level control means, output level control means for correcting the signal level of the audio signal outputted from the arithmetic processing means in an interlocking relationship with correction of the signal level by the input level control means, and delay means for delaying the correction of the signal level by the output level control means from the correction of the signal level by the input level control means in response to a delay time produced with the audio signal by the arithmetic means, wherein the delay time of the delay means is equal to a sum total of a conversion time of the analog to digital conversion means, a processing time of the digital signal processing means and a conversion time of the digital to analog conversion means.

According to a further aspect of the present invention, there is provided an audio signal processing apparatus wherein an input audio signal successively inputted thereto is arithmetically processed to apply various processes to the audio signal and a resulting signal is outputted, including input level control means for correcting a signal level of the input audio signal, arithmetic processing means for arithmetically processing the audio signal outputted from the input level control means, output level control means for correcting the signal level of the audio signal outputted from the arithmetic processing means in an interlocking relationship with correction of the signal level by the input level control means, and delay means for delaying the correction of the signal level by the output level control means from the correction of the signal level by the input level control means in response to a delay time produced with the audio signal by the arithmetic means, wherein the delay time of the delay means is equal to a sum total of the conversion time of the analog to digital conversion means, the processing time of the digital signal processing means and the conversion time of the digital to analog conversion means, and the delay time is calculated by a central control circuit section for controlling a characteristic of the digital signal processing means.

With the audio signal processing apparatus, since correction of an output signal level which is performed in an interlocking relationship with correction of an input side signal level is delayed by a time equal to a delay time of the arithmetic processing means, an unnatural variation of the output signal level is prevented.

The above and other objects, features and advantages of the present invention will become apparent from the following description and the appended claims, taken in conjunction with the accompanying drawings in which like parts or elements are denoted by like reference characters.

BRIEF DESCRIPTION OF THE DRAWINGS

FIG. 3 is a block diagram of a digital effector showing a preferred embodiment of the present invention;

DESCRIPTION OF THE PREFERRED EMBODIMENTS

Figure 1:
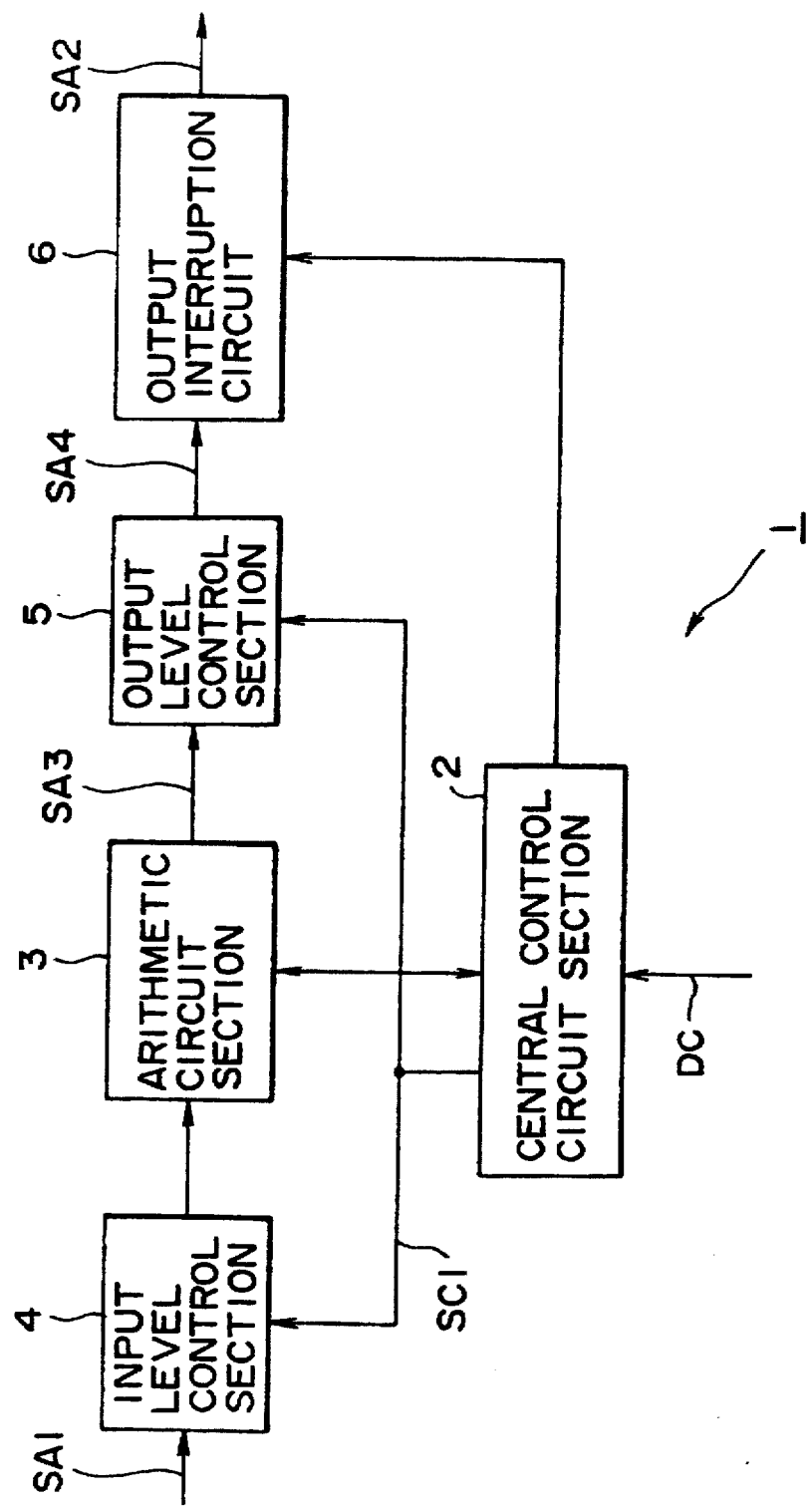
FIG. 1 is a block diagram showing a conventional digital effector.
Figures 2A, 2B, 2C:
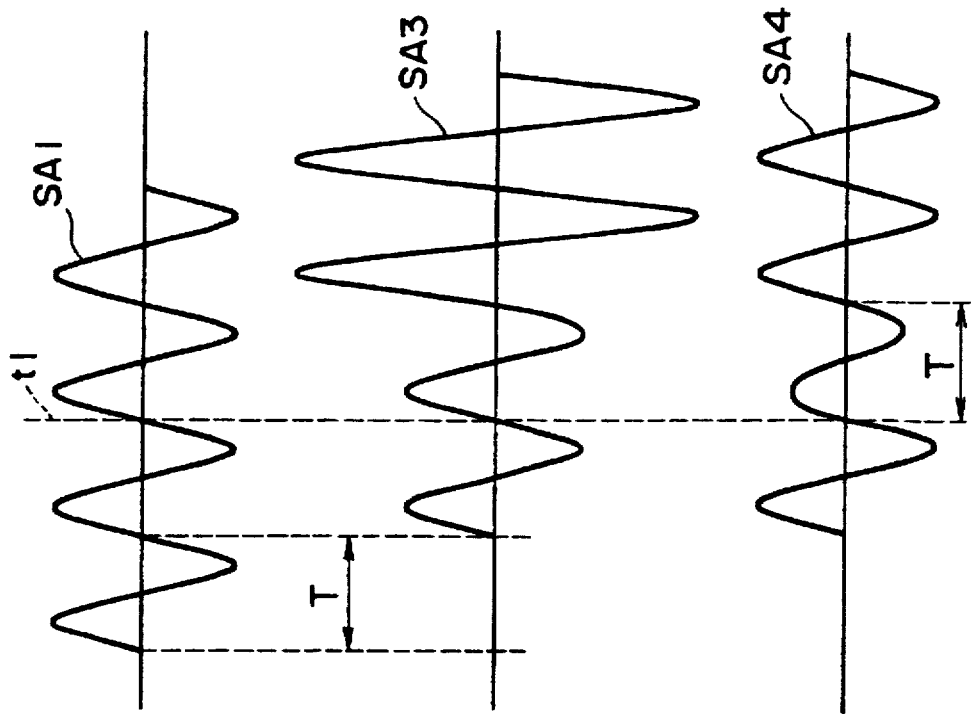
FIGS. 2(A) to 2(C) are signal waveform diagrams illustrating operation of the digital effector of FIG. 1.

Hereinafter, preferred embodiments will be described with reference to the accompanying drawings.

FIG. 3 is a block diagram showing a digital effector according to a first preferred embodiment of the present invention. Referring to FIG. 3, the digital effector shown is generally denoted at 10 and includes an input level control section 11 which varies the gain thereof in response to an input level control signal SC3 outputted from a central control circuit section 12, amplifies, or suppresses the signal level of, an input audio signal SA1 with the variable gain and outputs a resulting audio signal. Consequently, the input level control section 11 corrects the signal level of the input audio signal SA1 so that the peak level may remain within a prescribed range defined for a following arithmetic circuit section 13, and outputs a resulting audio signal of the corrected signal level.

The arithmetic circuit section 13 inputs the resulting audio signal SA1 to an analog to digital conversion circuit (A/D) 14. Here, the analog to digital conversion circuit 14 performs analog to digital conversion processing for the audio signal SA1 to convert the audio signal SA1 into a digital audio signal and outputs the digital audio signal.

A following digital signal processor (DSP) 15 arithmetically processes successive audio data, which form the digital audio signal, by an arithmetic processing circuit (not shown) of a digital filter circuit configuration. In this instance, the digital signal processor 15 switches the characteristic of the arithmetic processing circuit thereof by data communication with the central control circuit section 12 so as to apply an effect such as reverberation of a desired reverberation time or apply effects of auditions obtained in various sound fields to the digital audio signal.

A following digital to analog conversion circuit (D/A) 16 performs digital to analog conversion of the digital audio signal outputted from the digital signal processor 15 to convert the digital audio signal into an audio signal SA5 in the form of an analog signal and outputs the audio signal SA5.

An output level control section 17 varies the gain thereof in an interlocking relationship with the input level control section 11 in response to an output level control signal SC4, and amplifies, or suppresses the signal level of, the audio signal SA5 outputted from the arithmetic circuit section 13 with the variable gain and outputs a resulting audio signal. In this instance, the output level control section 17 corrects the signal level of the audio signal SA5, for example, with a characteristic reverse to that of the input level control section 11 so that it outputs an audio signal SA6 with a signal level equal to that of the input audio signal SA1.

The central control circuit section 12 is formed from a microcomputer for controlling the operation of the entire digital effector 1, and outputs control data to the arithmetic circuit section 13 in response to a control command DC inputted thereto from an external apparatus such as a controller so as to set various effects to be added to the audio signal. Further, the central control circuit section 12 outputs an input level control signal SC3 and an output level control signal SC4 to the input level control section 11 and the output level control section 17 in response to a manual operation of an operator to vary the correction levels by the input level control section 11 and the output level control section 17, respectively.

Further, the central control circuit section 12 controls, in the series of operations described above, a display section 19 so that the signal level of the input audio signal SA1 is displayed and effects to be applied to the audio signal and so forth are displayed. Consequently, if a control command DC for correcting a signal level is inputted from the controller or the like by a manual operation of the operator who has visually confirmed the display of the signal level of the input audio signal SA1, then the central control circuit section 12 outputs an input level control signal SC3 and an output level control signal SC4 in response to the control command DC so that the gain between the input and the output of the digital effector 1 set in advance may be maintained.

The central control circuit section 12 detects a delay time of the digital audio signal, which varies in response to effects added by the digital signal processor 15, by data communication with the digital signal processor 15. Further, the central control circuit section 12 adds a time required for the analog to digital conversion processing of the analog to digital conversion circuit 14 and another time required for the digital to analog conversion processing of the digital to analog conversion circuit 16 to the thus detected delay time to calculate a delay time until the audio signal inputted to the arithmetic circuit section 13 is outputted.

The central control circuit section 12 outputs the input level control signal SC3 to the input level control section 11 so that the correction level may be varied immediately in response to the control command DC, but outputs the output level control signal SC4 to the output level control section 17 so that the correction level may be varied after a delay of the delay time calculated in this manner thereby to prevent an unnatural variation of the output signal level.

Figures 4A, 4B, 4C:
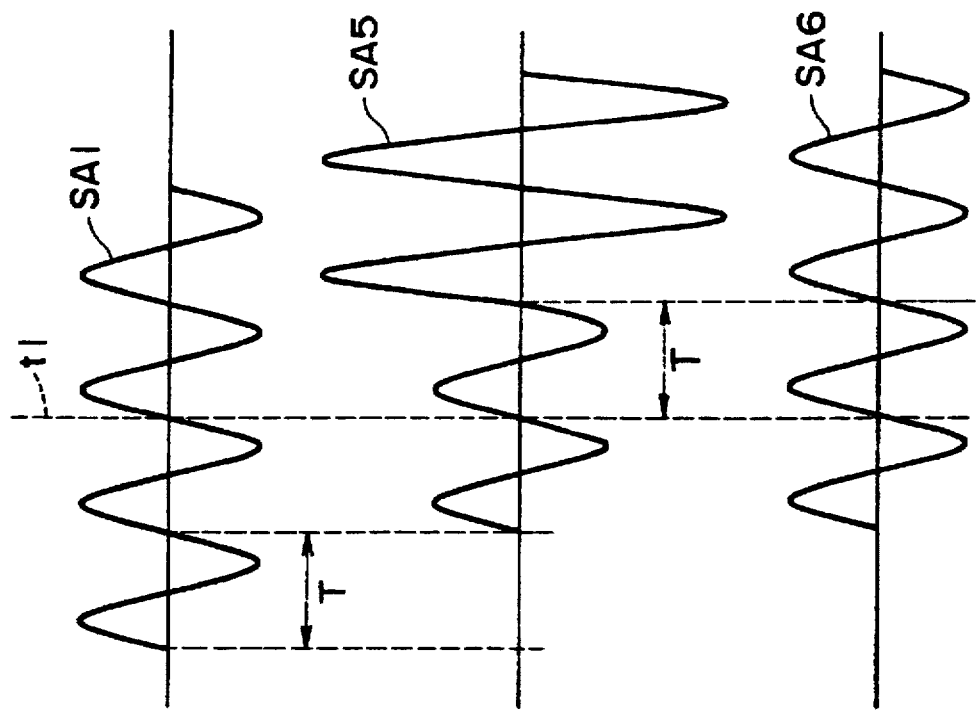
FIGS. 4(A) to (4C) are signal waveform diagrams illustrating operation of the digital effector of FIG. 3.

In particular, as seen from FIGS. 4(A) to 4(C), the audio signal SA5 (FIG. 4(B)) outputted from the arithmetic circuit section 13 is outputted after a delay of the delay time T of the arithmetic circuit section 13 from the input audio signal SA1 (FIG. 4(A)). Accordingly, when the gain of the input level control section 11 is switched at a point t1 of time, the audio signal SA5 outputted from the arithmetic circuit section 13 exhibits a variation of the signal level thereof at a timing delayed by a time equal to the delay time T after the point t1 of time.

Accordingly, if the correction level by the output level control section 17 is varied at the timing delayed by the delay time T by the central control circuit section 12, then the correction value for the audio signal SA5 can be varied at a timing corresponding to that on the input side. Consequently, an unnatural variation of the signal level of the audio signal SA6 can be prevented (FIG. 4(C)).

In the digital effector 1 of the construction described above, the input audio signal SA1 is corrected in signal level with the correction level set by the input level control signal SC3 by the input level control section 11 and then is converted into a digital audio signal by the analog to digital conversion circuit 14 of the arithmetic circuit section 13. The digital audio signal is converted into an audio signal SA5 of an analog signal by the digital to analog conversion circuit 16 after various effects are applied to it by the digital signal processor 15.

The audio signal SA5 is corrected in signal level by and outputted from the output level control section 17. In this instance, the delay time T of the arithmetic circuit section 13 is calculated by data communication between the digital signal processor 15 and the central control circuit section 12, and variation of the correction level of the audio signal SA5 is performed by the output level control section 17 at a timing delayed by a time equal to the delay time T by variation of the correction level by the input level control section 11. Consequently, the correction level of the audio signal SA5 is corrected at a timing corresponding to the timing on the input side to correct the signal level, and as a result, the audio signal SA5 is outputted while an unnatural variation of the signal level thereof is prevented.

With the digital effector 1 of the construction described above, since the delay time T of the arithmetic circuit section 13 is calculated by data communication between the digital signal processor 15 and the central control circuit section 12 and variation of the correction level by the output level control section 17 is performed at a timing delayed by the thus calculated delay time T from variation of the correction level by the input level control section 11, an unnatural variation of the output signal level can be prevented.

It is to be noted that, while in the digital effector 1 of the embodiment described above, the input level control signal SC3 and the output level control signal SC4 are outputted from the central control circuit section 12 to vary the correction levels by the input level control section 11 and the output level control section 17, the present invention is not limited to the specific construction, and where the correction levels on the input side and the output side are varied in response to a single control signal outputted from the central control circuit section 12 or in a like case, a delay circuit may be provided to adjust a timing of such correction.

Figure 5:
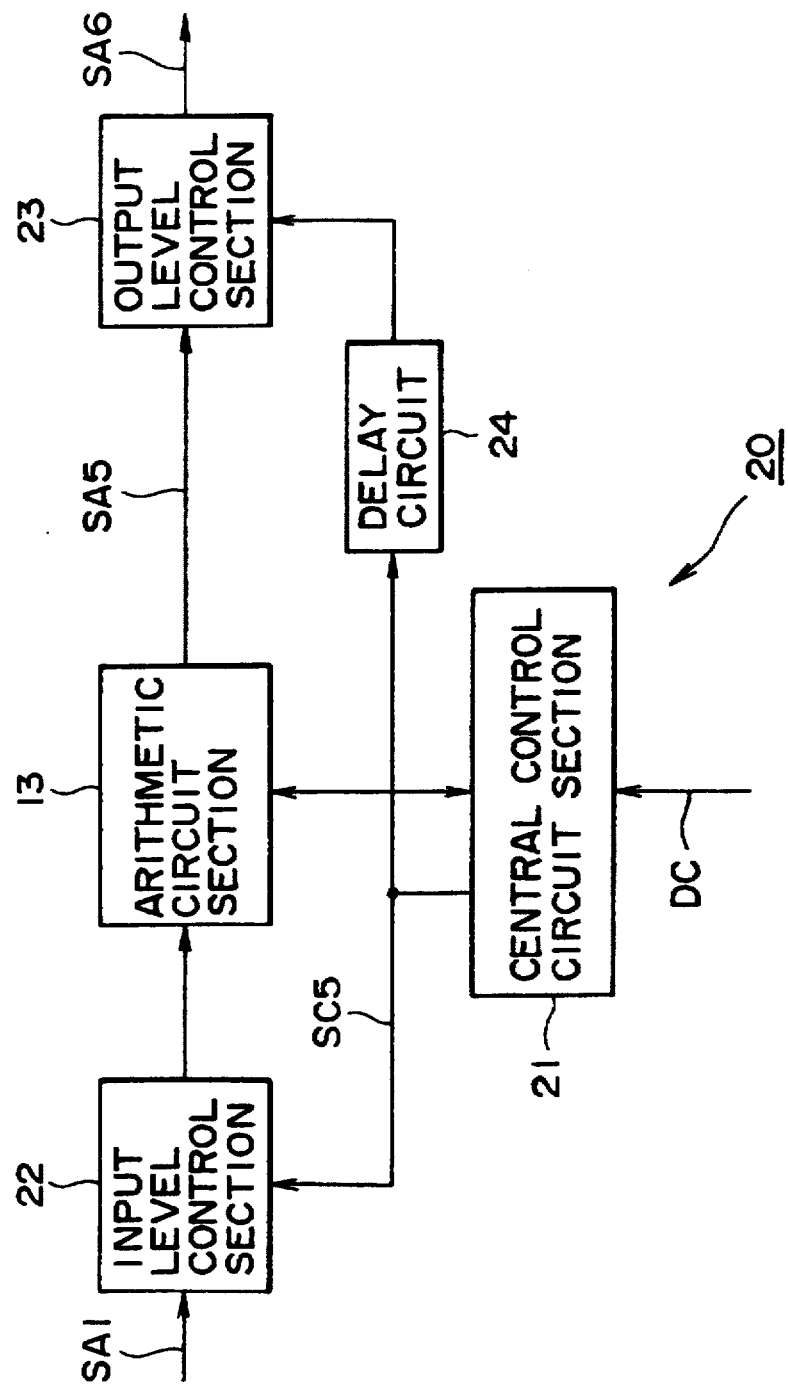
FIG. 5 is a block diagram of another digital effector showing another preferred embodiment of the present invention.
Figure 6:
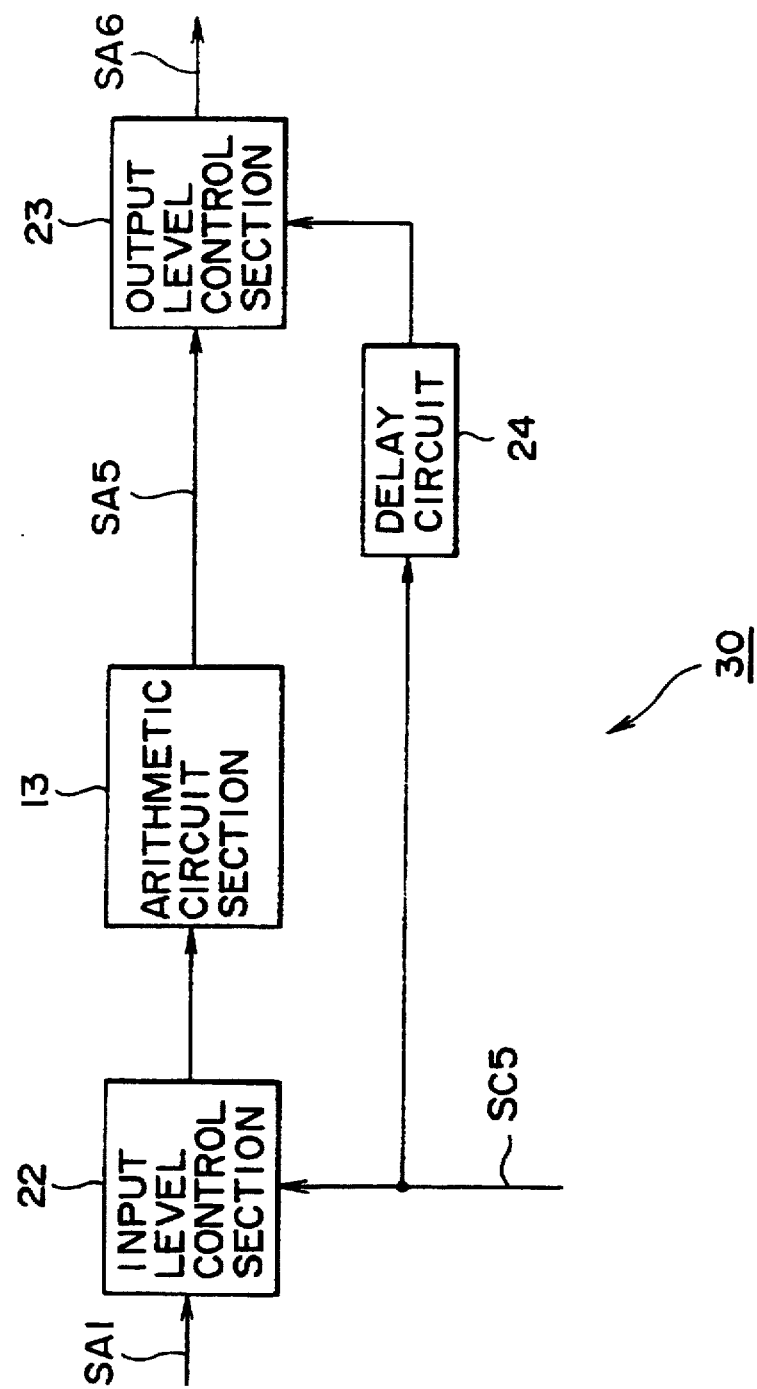
FIG. 6 is a block diagram showing a digital effector which inputs a control signal directly by an operation of an operator.

Referring to FIG. 5, there is shown in block diagram a digital effector according to another embodiment of the present invention. It is to be noted that, in FIG. 5, elements common to those of FIG. 3 are denoted by like reference characters and overlapping description of them is omitted here. In the present digital effector which is denoted by 20, a single control signal SC5 outputted from a central control circuit section 21 is outputted to an input level control section 22 and an output level control section 23. Consequently, the input level control section 22 and the output level control section 23 vary the gains thereof in a complementary relationship to each other in response to the control signal SC5.

A delay circuit 24 delays the control signal SC5 outputted from the central control circuit section 21 by a time equal to the delay time T of the arithmetic circuit section 13 and outputs the delayed control signal to the output level control section 23. In this manner, when a single control signal is outputted from the central control circuit section 12 to vary the correction levels of the input side and the output side, the timing of the correction is adjusted by a delay circuit. Consequently, similar effects to those of the first embodiment can be obtained.

The construction wherein the correction timings are adjusted by provision of a delay circuit in this manner can be applied also to a construction wherein an input level control signal SC3 and an output level control signal SC4 are outputted from the central control circuit section 12 to vary the correction levels by the input level control section 11 and the output level control section 17 as in the first embodiment.

Further, while in the embodiment described above, the correction levels are varied by the central control circuit section 12, the present invention is not limited to the specific construction and can be applied widely to also a case wherein the correction levels are varied by a direct operation of an operator, for example, as shown in FIG. 4. In particular, the digital effector 30 shown in FIG. 4 is constructed such that a control signal SC5 is inputted directly by an operation of an operator. In this instance, even if the timing of correction is adjusted by the delay circuit 24, similar effects to those of the first embodiment can be achieved.

Having now fully described the invention, it will be apparent to one of ordinary skill in the art that many changes and modifications can be made thereto without departing from the spirit and scope of the invention as set forth herein.

What is claimed is:

1. An audio signal processing apparatus wherein an input analog audio signal successively inputted thereto is arithmetically processed by a selected one of a plurality of arithmetic processes, said apparatus comprising:

input level control means for controlling a signal level of the input analog audio signal;

analog to digital converting means for converting the controlled input analog audio signal to a digital audio signal;

digital signal processing means for arithmetically processing the digital audio signal from said analog to digital conversion means according to the selected one of the arithmetic processes and for providing processing time data;

digital to analog converting means for converting the processed digital audio signal to an analog signal;

output level control means for controlling the signal level of the audio signal output from said digital to analog converting means in an interlocking relationship with a signal level controlled by said input level control means;

delay calculation means for calculating a delay time equal to a time required to process the input analog signal in the analog to digital converting means and the processed digital audio signal in the digital to analog converting means plus the time required for the processing of the signal based on the processing time data; and control means for delaying control of the output level control means in accordance with the calculated delay time.

2. The audio signal processing apparatus according to claim 1, wherein one of said plurality of arithmetic processes applies a reverberation effect to a signal input thereto.

3. An audio signal processing apparatus wherein an input analog audio signal fed thereto is selectively processed according to a selected one of a plurality of arithmetic processes, the apparatus comprising:

a central control circuit;

input level control means for controlling a signal level of the input analog audio signal in response to a first control signal from said central control circuit;

analog to digital converting means for converting the level controlled analog audio input signal to a digital audio signal;

digital signal processing means for performing said selected arithmetic process on said digital audio signal in response to a second control signal from said central control circuit and for generating processing time data;

digital to analog converting means for converting the processed digital audio signal to a processed analog signal; and output level control means for controlling the signal level of the processed analog signal from said digital to analog converting means in an interlocking relationship with said input level control means in response to a third control signal from said central control circuit, wherein said central control circuit determines a signal processing time for said digital signal processing means to perform the selected arithmetic process based on said processing time data and adds said signal processing time to respective converting times of said analog to digital converting means and said digital to analog converting means to form a selected delay time and produces said third control signal with a time delay equal to said selected delay time following production of said first control signal.

4. An audio signal processing apparatus wherein an input analog audio signal fed thereto is selectively processed to apply one of a plurality of arithmetic processes, said apparatus comprising:

a central control circuit;

input level control means for controlling a signal level of the input analog audio signal in response to a first control signal from said central control circuit;

arithmetic processing means for selectively providing one of the arithmetic processes to the level controlled audio signal from said input level control means in response to a second control signal from said central control circuit and for providing processing time data;

delay means for calculating a time delay equal to a processing time of said arithmetic processing means for the one of the arithmetic processes based on the processing time data, said delay means receiving said first control signal and producing a second control signal delayed from said first control signal by said calculated delay; and output level control means for controlling the signal level of the audio signal output from said arithmetic processing means in an interlocking relationship with said input level control means in response to said second control signal from said delay means.

* * * * *